(12) United States Patent
Koo et al.

(10) Patent No.: US 10,204,037 B2
(45) Date of Patent: Feb. 12, 2019

(54) MEMORY DEVICE, MEMORY CONTROLLER AND OPERATION METHOD THEREOF

(71) Applicant: SK hynix Inc., Gyeonggi-do (KR)

(72) Inventors: Ja-Hyun Koo, Gyeonggi-do (KR); Jung-Hyun Kwon, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/784,713

(22) Filed: Oct. 16, 2017

(65) Prior Publication Data

US 2018/0232267 A1 Aug. 16, 2018

(30) Foreign Application Priority Data

Feb. 13, 2017 (KR) ........................ 10-2017-0019343

(51) Int. Cl.
| | |
|---|---|
| *G06F 12/00* | (2006.01) |
| *G06F 11/07* | (2006.01) |
| *G11C 29/52* | (2006.01) |
| *G11C 29/02* | (2006.01) |
| *G11C 29/00* | (2006.01) |

(52) U.S. Cl.
CPC ............ *G06F 12/00* (2013.01); *G06F 11/073* (2013.01); *G06F 11/076* (2013.01); *G11C 29/024* (2013.01); *G11C 29/52* (2013.01); *G11C 29/00* (2013.01)

(58) Field of Classification Search
CPC ....... G06F 11/076; G06F 11/073; G11C 29/52
See application file for complete search history.

(56) References Cited

U.S. PATENT DOCUMENTS

| | | | | |
|---|---|---|---|---|
| 5,841,709 A | * | 11/1998 | McClure .................. | G11C 29/24 365/200 |
| 7,783,941 B2 | * | 8/2010 | Kim ........................ | G11C 29/42 714/711 |
| 7,787,034 B2 | * | 8/2010 | Ying ...................... | H04N 5/3696 348/247 |
| 2003/0208704 A1 | * | 11/2003 | Bartels ...................... | H04L 1/22 714/11 |
| 2004/0162959 A1 | | 8/2004 | Adelmann | |

FOREIGN PATENT DOCUMENTS

KR            101059005            8/2011

* cited by examiner

*Primary Examiner* — Ajay Ojha
(74) *Attorney, Agent, or Firm* — IP & T Group LLP

(57) ABSTRACT

An operation method of a memory controller may include: performing a preset number of write operations on a redundancy region of a memory device, reading data of the redundancy region of the memory device, and detecting error bits which occur in the data, and generating an identifier corresponding to the memory device based on the detected error bits.

17 Claims, 3 Drawing Sheets

MEMORY DEVICE, MEMORY CONTROLLER AND OPERATION METHOD THEREOF

CROSS-REFERENCE TO RELATED APPLICATIONS

The present application claims priority of Korean Patent Application No. 10-2017-0019343, filed on Feb. 13, 2017, which is incorporated herein by reference in its entirety.

BACKGROUND

1. Field

Various embodiments relate to a memory device, and more particularly, to a method for generating and allocating an identifier of a memory device.

2. Description of the Related Art

A memory system including a memory device is applied to various electronic devices for consumers or industries, for example, computers, mobile phones, Portable Digital Assistants (PDA), digital cameras, game machines, navigation systems and the like, and used as a main memory device or secondary memory device. Such a memory system may be implemented as one of various types of storage devices depending on an interface protocol coupled to an electronic device to which the memory system is applied. For example, the various types of storage devices may include a Solid State Drive (SSD), MMC, embedded MMC (eMMC), Reduced Size MMC (RS-MMC), micro-MMC, Secure Digital (SD) card (SD, mini-SD or micro-SD), Universal Storage Bus (USB) device, Universal Flash Storage (UFS) device, Compact Flash (CF) card, smart media card and memory stick.

The memory devices or memory chips included in the memory system are fabricated according to a semiconductor fabrication process. The semiconductor fabrication process may include at least three steps as follows.

At the first step, a memory chip or die is fabricated by a semiconductor fabricator. Various logic blocks, memory structures and other semiconductor circuits are formed on a semiconductor wafer or arbitrary suitable substrate. A single wafer typically includes a large number of replicas of the same chip circuit. After the wafer process, the produced chip circuits are tested, and the wafer is cut into a plurality of dies. Since the dies are easily damaged, functional dies may be mounted on other materials, for example, a plastic tape, in order to facilitate an additional process.

At the second step, the memory chips including the functional dies may be initialized. Various components of the memory chips may be enabled and/or initialized for a specific application. Such a process may be performed by an initialization device configured to load specific initialization data onto the memory chips. For the specific application, the same initialization data may be loaded to all of the memory chips. This step makes the memory chips suitable for the specific application.

At the third step, the memory chips are individualized through keys and/or identifiers. For example, security application suppliers may use a key and/or identifier for a desired security application. For this operation, different individualization data may be loaded to the respective memory chips at this moment.

Typically, a key and/or identifier are generated through a key and/or identifier generator having a specific encryption algorithm. Since such an encryption algorithm is based on mathematical characteristics, a key and/or identifier calculated through the encryption algorithm inevitably has a specific pattern. Therefore, when the encryption algorithm of the key and/or identifier generator is captured, the key and/or identifier generated through the corresponding encryption algorithm may be easily decoded by an unapproved user.

SUMMARY

Various embodiments are directed to a method for generating and allocating an identifier capable of distinguishing a memory device, based on a characteristic of the memory device.

In accordance with an embodiment of the present invention, an operation method of a memory controller includes: performing a preset number of write operations on a redundancy region of a memory device; reading read data from the redundancy region of the memory device, and detecting error bits which occur in the read data; and generating an identifier for the memory device based on the detected error bits.

In accordance with an embodiment of the present invention, a memory controller includes: a write/read operation control unit suitable for performing a preset number of write operations using write data on a redundancy region of a memory device; an error detection unit suitable for detecting error bits which occur in read data from the redundancy region of the memory device; and an identifier generation unit suitable for generating an identifier corresponding to the memory device based on the detected error bits.

In accordance with an embodiment of the present invention, a memory device includes: a memory cell array comprising a normal region and a redundancy region; and a control logic suitable for generating an identifier by performing a preset number of write operations on the redundancy region of the memory cell array, in response to a command indicating an entry into a preset operation mode.

DETAILED DESCRIPTION

Figure 1:
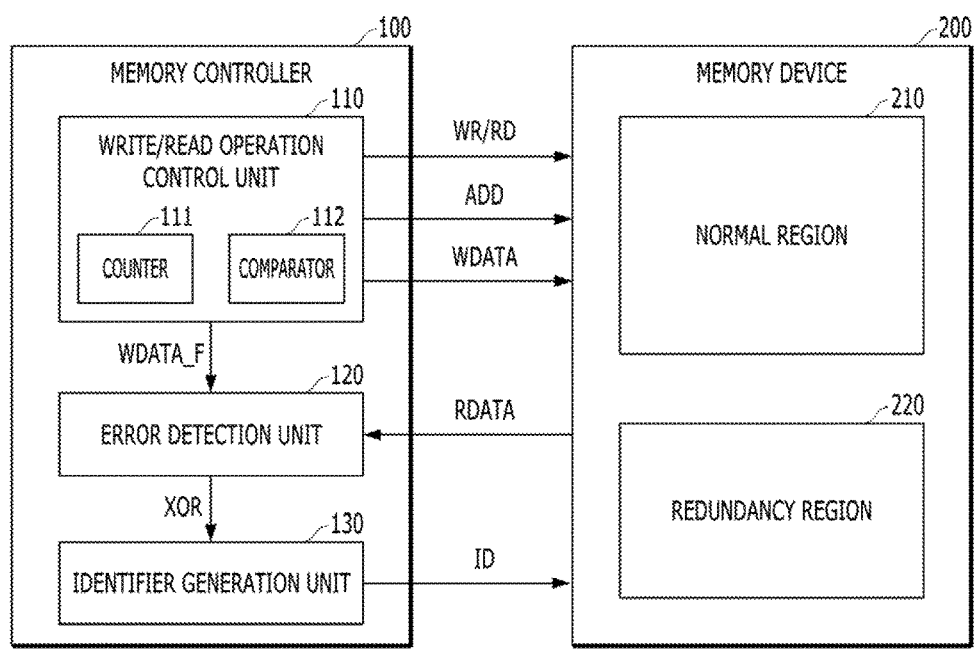
FIG. 1 is a block diagram illustrating a memory controller in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a memory controller 100 operatively coupled to a memory device 200, in accordance with an embodiment of the present invention.

Referring to FIG. 1, the memory controller 100 may include a test device (not shown) which is coupled to the memory device 200, tests the memory device 200 and loads data onto the memory device 200 depending on a test result. The memory controller 100 may test various circuits of the memory device 200 or input values for the circuits, while the memory device 200 is fabricated.

The memory device 200 may include a volatile memory device or a nonvolatile memory device. For example, the memory device 200 may include a memory device using a resistance material, for example, a Phase-change Random Access Memory (PRAM), a Magnetoresistive RAM (MRAM) or a Resistive RAM (RRAM).

While a Dynamic RAM (DRAM) or a Flash memory stores data using a charge, the memory device using a resistance material stores data using a state change of a phase change material such as a chalcogenide alloy (in case of PRAM), a resistance change of a Magnetic Tunnel Junction (MJT) thin film depending on a magnetization state of a ferromagnetic material (in case of MRAM), or a resistance change of a variable resistance material (in case of RRAM). Representatively, a unit memory cell of a PRAM may include one cell transistor coupled to a word line and one variable resistor coupled to a bit line. The variable resistor is formed of a phase change material such as a specific thin-film material referred to as chalcogenide alloy.

A PRAM can store data using a state change of the phase change material according to a current applied to the corresponding memory cell. That is, the phase change material may have a crystalline phase or amorphous phase depending on the current applied thereto, and the memory cell may store data using the characteristic that the crystalline state has different resistance from the amorphous phase.

When a low current equal to or less than a threshold value is applied to the memory cell including a phase change resistor, the phase change resistor may have a temperature suitable for crystallization. Then, the memory cell may be converted into a crystalline phase, and become a low-resistance material. On the other hand, when a high current exceeding the threshold value is applied to the memory cell, the phase change resistor may have a temperature equal to or more than the melting point. Then, the memory cell may be converted into the amorphous phase, and become a high-resistance material.

As such, the memory cells of a PRAM may have one of two states, i.e., a crystalline state or an amorphous state, during a write operation. The crystalline state may indicate a logic level '0' (Logical 0) of data because the resistance has a relatively small magnitude, and the amorphous state may indicate a logic level '1' (Logical 1) of data because the resistance has a relatively large magnitude. A write operation of changing the data of the memory cell from the logic level '0' to the logic level '1' may be referred to as a RESET operation, and a write operation of changing the data of the memory cell from the logic level '1' to the logic level '0' may be referred to as a SET operation.

Figure 2:
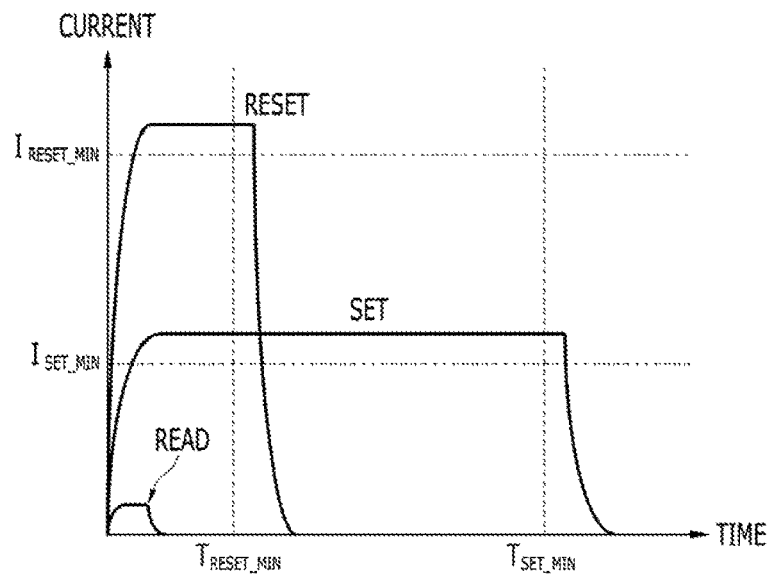
FIG. 2 is a graph illustrating exemplary current pulses for write and read operations of a memory device illustrated in FIG. 1.

FIG. 2 is a graph illustrating exemplary current pulses for write and read operations of the memory device 200 illustrated in FIG. 1.

Referring to FIG. 2, a write operation includes a RESET operation and a SET operation for writing data to memory cells, i.e., for changing the state of the phase change material during the write operation. Therefore, as illustrated in FIG. 2, a large amount of current and a longer latency is required for the write operation (refer to RESET and SET pulses). On the other hand, the read operation is an operation for sensing only the current state of the phase change material. Therefore, a small amount of current and a shorter latency is required for the read operation (refer to READ pulse).

Therefore, the write operation performed on the memory device 200 may cause a large amount of current to flow into the phase change material, and continuously change the state of the phase change material, compared to the read operation. As a result, the memory device 200 may be worn out. Typically, in order to ensure normal operation and storing of the data in the memory cells of the memory device 200, the number of write operations are limited to a maximum preset number. For example, the maximum preset number may be $10^7$ write operations per memory cell. This means that when data are written more than $10^7$ times to a memory cell, an error may occur in the data stored in the memory cell.

Errors which occur in a plurality of memory cells may differ depending on the fabrication environment or operation condition of the memory device 200. That is, depending on a characteristic of the memory device 200, random but unique error bits may occur in the data stored in the plurality of memory cells. In accordance with the present embodiment, the memory controller 100 may generate error bits in the memory device 200, detect the generated error bits, and generate an identifier for distinguishing the memory device 200.

Referring back to FIG. 1, the memory controller 100 may include a write/read operation control unit 110, an error detection unit 120 and an identifier generation unit 130. The memory device 200 may include a normal region 210 and a redundancy region 220 for replacing defective memory cells of the normal region 210. In accordance with the present invention, the redundancy region 220 may be used for a write/read operation for generating an identifier for distinguishing the memory device 200.

The write/read operation control unit 110 may perform a preset number of write operations on a region of the memory device 200. For example, the write/read operation control unit 110 may perform a preset number of write operations on the redundancy region 220 of the memory device 200. The write/read operation control unit 110 may transmit a command WR indicating a write operation and an address ADD indicating the redundancy region 220 of the memory device 200 to the memory device 200, in order to perform the write operation.

In accordance with the present embodiment, the write/read operation control unit 110 may include a counter 111 and a comparator 112. The counter 111 may increase a count value by one each time a write operation is performed on the memory device 200. Moreover, each time the count value is increased, the comparator 112 may compare the count value to a preset number.

Until the count value reaches the preset number, the write/read operation control unit 110 may repeat the write operation by continuously transmitting the command WR and the address ADD to the memory device 200. At this time, write data WDATA may be simultaneously transmitted at a logic level of '0' or '1'. Desirably, while repeating the write operation, the write/read operation control unit 110 may alternately transmit the write data WDATA at logic levels of '0' and '1'.

When the count value reaches the preset number, the write/read operation control unit 110 may transmit a command RD and an address ADD to the memory device 200, and perform a read operation. At this time, the address ADD may indicate the redundancy region 220 of the memory device 200. Furthermore, the write/read operation control unit 110 may transmit the write data WDATA, which is finally transmitted to the memory device 200, (hereinafter, referred to as "final write data WDATA_F") to the error detection unit 120.

The error detection unit 120 may detect error bits which occurred in read data RDATA read from the redundancy region 220 of the memory device 200. The error detection unit 120 may compare the final write data WDATA_F transmitted from the write/read operation control unit 110 to the read data RDATA. For this operation, the error detection unit 120 may detect the error bits by performing an XOR operation on the final write data WDATA_F and the read data RDATA.

After performing the XOR operation on the final write data WDATA_F and the read data RDATA, an XOR operation result XOR may be obtained. The XOR operation result XOR may have a first logic level, e.g., a logic level '0' for corresponding bits of the final write data WDATA_F and the read data RDATA having the same logic level, among a plurality of corresponding bits of the final write data WDATA_F and the read data RDATA. The XOR operation result XOR may have a second logic level, e.g., a logic level '1' for corresponding bits of the final write data WDATA_F and the read data RDATA having different logic levels, among the plurality of corresponding bits of the final write data WDATA_F and the read data RDATA. Therefore, the bits having the second logic level in the XOR operation result XOR may indicate a distribution of error bits and correspond to the detected error bits.

The identifier generation unit 130 may generate an identifier ID corresponding to the memory device 200 based on the XOR operation result XOR. The write data WDATA and the read RDATA inputted to and outputted from the memory device 200 during the write and read operations may correspond to one memory block of the redundancy region 220. That is, the write data WDATA, the read RDATA and the XOR operation result XOR may be constituted by 512 bits, and the identifier generation unit 130 may generate the identifier ID using a half or part of 512 bits.

For this operation, the identifier generation unit 130 may divide the XOR operation result XOR, into a plurality of sections. The identifier generation unit 130 may select one of the plurality of sections as the identifier ID, based on the error bit distribution of the XOR operation result XOR. For example, the identifier generation unit 130 may count the bits having the second logic levels in the plurality of the sections, and select the section having the largest count value as the identifier ID.

In an embodiment, the identifier generation unit 130 may select the entire XOR operation result XOR itself as the identifier ID. This may depend according to the desired security level of a system to which the memory device 200 is applied. The generated identifier ID may be retransmitted to the memory device 200, and stored in a specific memory block of any of the normal region 210 and the redundancy region 220.

In accordance with the above-described embodiment, the memory controller 100 may generate the identifier ID after repeatedly performing the write operation by continuously transmitting the command/address WR/ADD and the write data WDATA corresponding to the write operation to the memory device 200 many times. In accordance with another embodiment, however, the memory device 200 may repeatedly perform a write operation and store the corresponding identifier ID after receiving the command/address WR/ADD and the write data WDATA from the memory controller 100 once. This embodiment will be described in detail with reference to FIG. 3.

Figure 3:
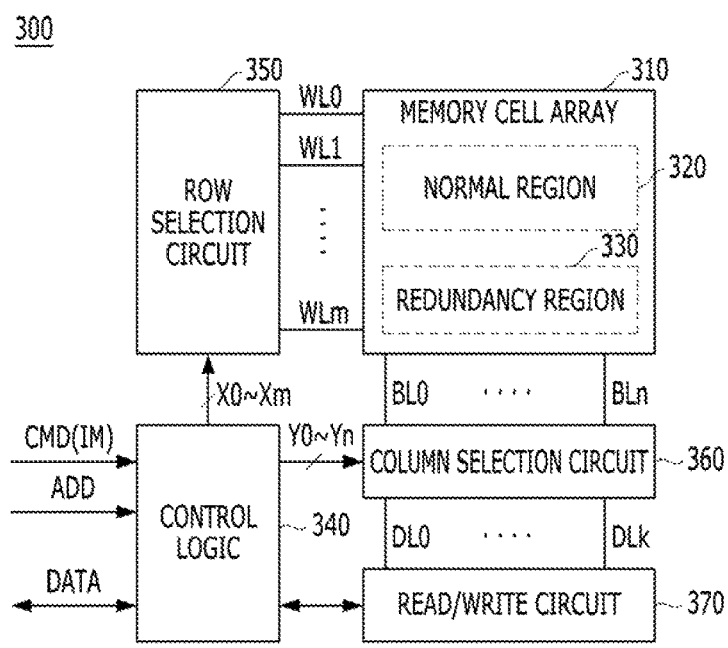
FIG. 3 is a block diagram illustrating a memory device in accordance with an embodiment of the present invention.

FIG. 3 is a block diagram illustrating a memory device 300 in accordance with an embodiment of the present invention.

Referring to FIG. 3, the memory device 300 in accordance with the present embodiment may include a memory cell array 310, a control logic 340, a row selection circuit 350, a column selection circuit 360 and a read/write circuit 370.

The memory cell array 310 may include a plurality of memory cells having rows and columns arranged in a matrix shape. The rows of the plurality of memory cells may be coupled to word lines WL0 to WLm, respectively, and the columns of the plurality of memory cells may be coupled to bit lines BL0 to BLn, respectively. Each of the memory cells may include a memory element and an access element. The memory element may include a phase change material having a different resistance value depending on a crystalline state or an amorphous state, and the access element may control a current flowing through the memory element. The access element may correspond to a diode or transistor coupled in series to a variable resistance element.

The plurality of memory cells included in the memory cell array 310 may be divided into a normal region 320 and a redundancy region 330. Both of the normal region 320 and the redundancy region 330 may include memory cells and have the same structure. A memory cell of the redundancy region 330 may be used to replace a memory cell having a defect among the memory cells included in the normal region 320.

The control logic 340 may control the row selection circuit 350, the column selection circuit 360 and the read/write circuit 370, in response to a command CMD and address ADD provided from an external device, for example, the memory controller 100 of FIG. 1 or a host (not shown). Furthermore, the control logic 340 may transmit data DATA provided from the external device to the read/write circuit 370, or output data DATA read through the read/write circuit 370 to the external device.

In accordance with the present embodiment, the control logic 340 may receive a mode command IM from the external device. The mode command IM may be included in the command CMD, and indicate that the memory device entered a preset operation mode, for example, an identifier generation mode. The control logic 340 may repeatedly perform a preset number of write operations on the memory cell array 310, in response to the mode command IM.

The control logic 340 may receive the address ADD and the data DATA from the external device with the mode command IM. The address ADD may indicate the redundancy region 330 of the memory cell array 310, and the data DATA may correspond to any one of the logic levels '0' and '1'. Therefore, the control logic 340 may repeatedly write the data DATA to the redundancy region 330 of the memory cell array 310 by the preset number of times.

For this operation, the control logic 340 may include a decoding circuit (not illustrated). In order to select the word lines WL0 to WLm and the bit lines BL0 to BLn corresponding to the redundancy region 330 of the memory cell array 310, the control logic 340 may decode the address ADD, and provide a row selection signal X0 to Xm and a column selection signal Y0 to Yn to the row selection circuit 350 and the column selection circuit 360, respectively.

The row selection circuit 350 may select the corresponding word line among the plurality of word lines WL0 to WLm in response to the row selection signal X0 to Xm, and the column selection circuit 360 may select the corresponding bit line among the plurality of bit lines BL0 to BLn in response to the column selection signal Y0 to Yn. The column selection circuit 360 may include a plurality of selection transistors. The plurality of selection transistors may couple the bit lines BL0 to BLn to data lines DL0 to DLk in response to the column selection signal Y0 to Yn.

The read/write circuit 370 may read/write data from/to a memory cell selected in the memory cell array 310. The read/write circuit 370 may read/write data from/to a memory cell coupled to a word line and a bit line, which are selected by the row selection circuit 350 and the column selection circuit 360, respectively. In the operation mode in accordance with the present embodiment, the read/write circuit 370 may repeatedly write data DATA to the selected memory cell of the memory cell array 310 by the preset number of times, according to the control of the control logic 340.

For this operation, the read/write circuit 370 may receive the data DATA from the control logic 340, and apply a write bias corresponding to the data DATA to the selected memory cells of the memory cell array 310. The write bias may include the RESET and SET pulses (refer to FIG. 2). That is, the read/write circuit 370 may latch the received data DATA, and apply the write bias corresponding to the latched data DATA to the selected memory cells of the memory cell array 310 by the preset number of times.

The memory device 300, according to the present embodiment, may enter the preset operation mode in response to the mode command IM indicating the operation mode. Furthermore, according as the address ADD and the data DATA which are inputted from the external device once, the memory device 300 may repeatedly write the data DATA to a region corresponding to the address ADD in the memory cell array 310. Therefore, after the preset number of write operations using the data DATA fixed to the logic level '0' or '1', the data stored in the corresponding region of the memory cell array 310 may be used as the identifier ID of the memory device 300. As a result, the external device may generate and store identifiers ID corresponding to a plurality of memory devices by transmitting the command/address CMD/ADD and the data DATA to the memory devices only one time.

Hereinafter, referring to FIGS. 1 to 4, an operation of a memory controller will be explained in detail, according to an embodiment of the present invention.

Figure 4:
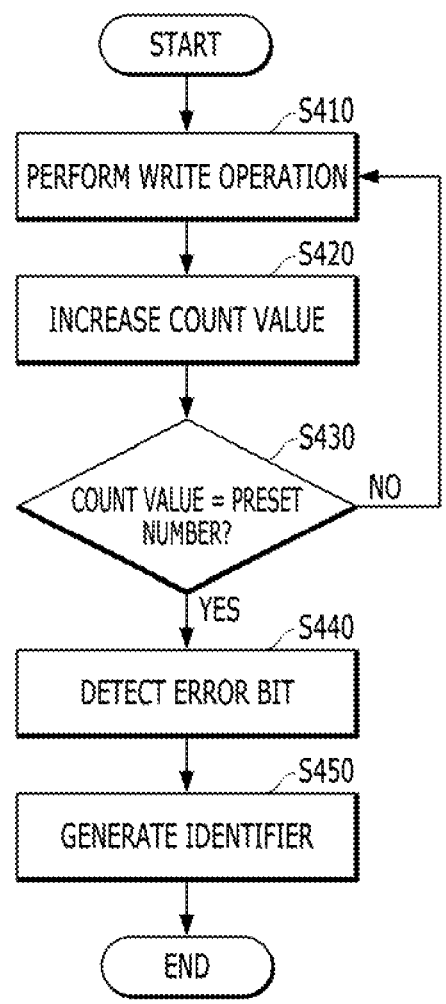
FIG. 4 is a flowchart of an operation of a memory controller in accordance with an embodiment of the present invention.

FIG. 4 is a flowchart of an operation of a memory controller in accordance with an embodiment of the present invention.

1) Write Operation S410

For a write operation of the memory device 200, the memory controller 100 may transmit an address ADD and write data WDATA with a command WR indicating the write operation. The address ADD may indicate the redundancy region 220 of the memory device 200, and the data DATA may have any one of the first and second logic levels. Thus, the memory device 200 may write the write data WDATA to the redundancy region 220.

2) Count Increasing and Comparison Operations S420 and S430.

Whenever the write operation is performed, the counter 111 of the write/read operation control unit 110 may increase the count value. The comparator 112 of the write/read operation control unit 110 may compare the count value to a preset number. The preset number may be set to equal to limited number of write operations on the memory device 200 for an error free operation.

When the count value does not reach the preset number (NO at step S430), the procedure may return to the write operation at step S410. That is, until the count value reaches the preset number, the write/read operation control unit 110 may repeat the write operation at step S410 and the counter 111 may increase the count value at step S420. Whenever the write operation is repeated, the write/read operation control unit 110 may perform the write operation using the write data WDATA having a logic level different from that of the write data WDATA for the previous write operation, between the first and second logic levels.

3) Error Bit Detection Operation S440

When the count value is equal to the preset number (YES at step S430), the write/read operation control unit 110 may transmit the final write data WDATA_F to the error detection unit 120, and read data RDATA from the redundancy region 220 of the memory device 200. The error detection unit 120 of the memory controller 100 may compare the read data RDATA to the final write data WDATA_F, and detect error bits which occurred in the read data RDATA from the redundancy region 220 of the memory device 200. For example, the error detection unit 120 may detect the error bits by performing an XOR operation on the read data RDATA and the final write data WDATA_F. Based on the XOR operation, the error detection unit 120 may obtain an XOR operation result XOR.

4) Identifier Generation Operation S450

The identifier generation unit 130 of the memory controller 100 may generate an identifier ID corresponding to the memory device 200 based on the XOR operation result XOR indicating the detected error bits. For this operation, the identifier generation unit 130 may divide the XOR operation result XOR into a plurality of sections. The identifier generation unit 130 may select one of the plurality of sections as the identifier ID, based on the error bit distribution of the XOR operation result XOR. For example, the identifier generation unit 130 may count the bits having the second logic levels in the plurality of sections, and select the section having the largest count value as the identifier ID.

In the detailed description, specific embodiments have been described. However, it should be understood that the embodiments are used for illustration purposes only and should not be used as limiting the description. For example, the phase change memory device has been exemplified in the above-described embodiments. However, the present embodiments may be applied to any nonvolatile memory device or volatile memory device. That is, in a memory device including a plurality of memory cells which may have different characteristics depending on the fabrication environment or operation condition, the memory cells may be exposed to an environment in which an error is likely to occur, in order to generate identifiers based on different characteristics.

In accordance with the described embodiments of the present invention, this technique can generate identifiers or encryption keys for distinguishing memory devices based on the characteristics of the memory devices, which may differ depending on the fabrication environments or operation conditions of the memory devices. Thus, when the identifiers of a plurality of memory devices are generated based on a specific algorithm, the security for all memory devices can be prevented from being vulnerable even though the algorithm is exposed.

Furthermore, through one operation command, the plurality of memory devices can generate and store identifiers at the same time. With the increase in number of memory devices, identifiers can be generated at higher speed, and allocated to the respective memory devices.

Although various embodiments have been described for illustrative purposes, it will be apparent to those skilled in the art that various changes and modifications may be made without departing from the spirit and scope of the invention as defined in the following claims.

What is claimed is:

1. An operation method of a memory controller, comprising:
performing a preset number of write operations on a redundancy region of a memory device;
reading read data from the redundancy region of the memory device, and detecting error bits which occur in the read data; and
generating an identifier for the memory device based on the detected error bits,
wherein the performing of the preset number of write operations includes:
increasing a count value and comparing the count value to the preset number each time the write operation is performed; and
repeatedly performing the write operation and increasing the count value until the count value reaches the preset number.

2. The operation method of claim 1, wherein the repeatedly performing of the write operation comprises:
performing the write operation using write data with a logic level different from that of the write data for a previous write operation, between first and second logic levels.

3. The operation method of claim 1, wherein the reading of the read data and the detecting of the error bits comprises:
reading the read data from the redundancy region of the memory device, when the count value is equal to the preset number; and
comparing the write data to the read data.

4. The operation method of claim 3, wherein the comparing of the write data to the read data comprises:
performing an XOR operation on the write data and the read data to detect the error bits.

5. The operation method of claim 4, wherein the generating of the identifier comprises:
dividing an XOR operation result into a plurality of sections; and
selecting one of the plurality of sections as the identifier based on a distribution of the detected error bits.

6. The operation method of claim 1, wherein the memory device comprises a nonvolatile memory device, and the preset number corresponds to a limited number of write operations on the nonvolatile memory device.

7. A memory controller comprising:
a write/read operation control unit suitable for performing a preset number of write operations using write data on a redundancy region of a memory device;
an error detection unit suitable for detecting error bits which occur in read data from the redundancy region of the memory device; and
an identifier generation unit suitable for generating an identifier corresponding to the memory device based on the detected error bits,
wherein the write/read operation control unit includes:
a counter suitable for increasing a count value by one when the write operation is performed; and
a comparator suitable for comparing the count value to the preset number.

8. The memory controller of claim 7, wherein, until the count value reaches the preset number, the write/read operation control unit repeats the write operation while alternately transmitting the write data at first and second logic levels.

9. The memory controller of claim 7, wherein, when the count value is equal to the preset number, the write/read operation control unit reads the read data from the redundancy region of the memory device.

10. The memory controller of claim 7, wherein the error detection unit detects the error bits by performing an XOR operation on the write data and the read data.

11. The memory controller of claim 10, wherein the identifier generation unit divides an XOR operation result into a plurality of sections, and selects one of the plurality of sections as the identifier based on a distribution of the detected error bits.

12. The memory controller of claim 7, wherein the memory device comprises a nonvolatile memory device, and the preset number corresponds to a limited number of write operations on the nonvolatile memory device.

13. The memory controller of claim 7, wherein the memory controller comprises:
a test device coupled to the memory device to test the memory device, and loading data based on a test result to the memory device.

14. A memory device comprising:
a memory cell array comprising a normal region and a redundancy region; and
a control logic suitable for generating an identifier by performing a preset number of write operations on the redundancy region of the memory cell array, in response to a command indicating an entry into a preset operation mode; and
a read/write circuit suitable for latching write data transmitted from the control logic, and applying a write bias corresponding to the latched data to a memory cell of the redundancy region by the preset number of times.

15. The memory device of claim 14, wherein the control logic generates a row selection signal and a column selection signal by decoding an address inputted with the command.

16. The memory device of claim 15, further comprising:
a row selection circuit suitable for selecting a word line corresponding to the row selection signal, among a plurality of word lines of the memory cell array; and
a column selection circuit suitable for selecting a bit line corresponding to the column selection signal, among a plurality of bit lines of the memory cell array,
wherein the read/write circuit reads/writes data from/to a memory cell coupled to the selected word line and the selected bit line.

17. The memory device of claim 14, wherein the memory device comprises:
a nonvolatile memory device, and the preset number corresponds to a limited number of write operations on the nonvolatile memory device.

* * * * *